United States Patent
Tu et al.

(10) Patent No.: US 7,219,824 B2
(45) Date of Patent: May 22, 2007

(54) MECHANISM AND PROCESS FOR COMPRESSING CHIPS

(75) Inventors: Chin-Chung Tu, Miaoli County (TW); Zheng-Jie Huang, Taoyuan County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 10/711,378

(22) Filed: Sep. 15, 2004

(65) Prior Publication Data

US 2006/0027916 A1 Feb. 9, 2006

(30) Foreign Application Priority Data

Aug. 3, 2004 (TW) .............................. 93123205 A

(51) Int. Cl.
  *B23K 37/00* (2006.01)
  *H01L 21/00* (2006.01)
  *F16D 3/00* (2006.01)
(52) U.S. Cl. .................... 228/5.5; 29/25.01; 403/57
(58) Field of Classification Search ................. 228/5.5; 29/25.01; 403/57
See application file for complete search history.

(56) References Cited

U.S. PATENT DOCUMENTS

| | | | | |
|---|---|---|---|---|
| 4,875,614 A | * | 10/1989 | Cipolla et al. ............... | 228/5.5 |
| 5,000,416 A | * | 3/1991 | Fantasia ..................... | 248/650 |
| 5,462,217 A | * | 10/1995 | Simmons et al. ....... | 228/180.22 |
| 5,899,798 A | * | 5/1999 | Trojan et al. ............... | 451/259 |
| 6,019,154 A | * | 2/2000 | Ma et al. .................... | 156/580 |
| 6,041,996 A | * | 3/2000 | Arikado ................. | 228/180.22 |
| 6,116,990 A | * | 9/2000 | Sinclair et al. ............. | 451/259 |
| 6,244,493 B1 | * | 6/2001 | Shimazaki et al. .......... | 228/5.5 |
| 6,486,660 B1 | * | 11/2002 | Luse et al. .................. | 324/210 |
| 6,540,592 B1 | * | 4/2003 | Schultz et al. ............. | 451/285 |
| 6,592,437 B1 | * | 7/2003 | Boyd et al. ................. | 451/285 |

OTHER PUBLICATIONS

IBM TDB, vol. 11, No. 8, Jan. 1969, p. 1026 entitled "Self_Leveling Soldering Tol" by N.F. Jensen.*
IBM TDB Technical Disclsoure Bulletien; vol. 31, No. 6 Nov. 1988, pp. 236-237 "Equal Force Planarity Device".*

* cited by examiner

Primary Examiner—Howard Weiss
Assistant Examiner—Shrininvas H. Rao
(74) Attorney, Agent, or Firm—Jianq Chyun IP Office

(57) ABSTRACT

A chip compressing mechanism is provided. The chip compressing mechanism essentially comprises a loading component, a head component and a gimbal. The head component is disposed under the loading component, with a gap in-between. The gimbal is disposed between the loading component and the head component to support the gap therebetween.

7 Claims, 3 Drawing Sheets

MECHANISM AND PROCESS FOR COMPRESSING CHIPS

BACKGROUND OF THE INVENTION

1. Field of the Invention

The present invention relates to a mechanism and process for compressing chips. More particularly, the present invention relates to a mechanism and process for compressing chips to promote the yield factor thereof.

2. Description of Related Art

With the computer hardware, Internet and multimedia technology rapidly developing, the transmission of image information has gradually upgraded from analog transmission to digital transmission. Moreover, the modern life style has called for a thinner and lighter display apparatus. Although the traditional display apparatus made of cathode ray tubes has its own advantages, its bulky size and the radiation emitted during display is still a problem. As a result, a new development combining optoelectronics and semiconductor manufacturing technologies, the flat panel display (FPD), including liquid crystal display (LCD), organic electro-luminescent display (OELD) and plasma display panel (PDP), has become the mainstream display product.

Most of the flat panel displays use transparent substrates, such as glass substrate, instead of the circuit boards often used in other electronic devices. And the main technology for bonding chips in the flat panel displays has developed in three areas: the chip on board (COB), the tape automated bonding (TAB) and the chip on glass (COG).

FIG. 1 is a schematic drawing of the conventional technology for bonding chips on glass. Referring to FIG. 1, it shows the conventional technology of chip on glass by bonding chip 50 onto the glass substrate 80. In a liquid crystal display (LCD), for example, the glass substrate 80 can be the thin film transistor (TFT) substrate. The glass substrate 80 has a plurality of contact pads 82 thereon, and the chip 50 has a plurality of gold bumps 52 thereon. Further, an anisotropic conductive film 70 (ACF) is placed between chip 50 and glass substrate 80. The chip 50 bonds with the glass substrate 80 by thermo compression operated by the mechanism 100. Further, the gold bumps 52 are electrically connected to the contact pads 82 by the conductive particles of the anisotropic conductive film 70. Meanwhile, the anisotropic conductive film 70 is solidified by high temperature so the electrical connection between the gold bumps 52 and the contact pads 82 is stabilized.

However, the chip compressing mechanism 100 offers a fixed direction of the acting force F1. If the fixed direction of the acting force F1 is not perpendicular to the glass substrate 80 (as shown in FIG. 1), the chip 50 will not bond to glass substrate 80 in a parallel angle and the yield factor thereof will be lowered. Furthermore, chip compressing is the latter part of the flat panel display manufacturing process, and a rework is nearly impossible. Therefore, a failed bonding will put the near-completed flat panel display to total waste.

In solution, the manufacturers try to calibrate the chip compressing mechanism before thermo-compressing each batch of the chips. But such calibration is time-consuming and adds extra cost. Furthermore, the calibrated mechanism does not guarantee perfect bonding between the chips and the glass substrate in a parallel angle. Therefore, promoting the yield factor of bonding chips onto the substrates is vital in the flat panel display manufacturing process.

SUMMARY OF THE INVENTION

Accordingly, one object of the present invention is to provide a chip compressing mechanism to promote the yield factor of bonding chips onto substrates.

Another object of the present invention is to provide a process for compressing chips to promote the yield factor of bonding chips onto substrates.

The present invention is directed to provide a chip compressing mechanism comprising a loading component, a head component and a gimbal, wherein the head component is disposed under the loading component, with a gap in-between. The gimbal is disposed between the loading component and the head component and to support the gap therebetween.

The present invention is also directed to provide a process for compressing chips with the mechanism described above. The process starts by disposing at least one chip on a substrate. And then, the chip is compressed onto the substrate by the chip compressing mechanism, wherein the pressure from the loading component is transferred by the gimbal through the head component onto the chip evenly in a direction perpendicular to the substrate.

To sum up, the present invention provides a mechanism and process for compressing chips, wherein the loading component is self-calibrated when compressing the chips, thereby promoting the yield factor of bonding chips onto the glass substrates.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE ILLUSTRATED EMBODIMENTS

Various specific embodiments of the present invention are disclosed below, illustrating examples of various possible implementations of the concepts of the present invention. The following description is made for the purpose of illustrating the general principles of the invention and should not be taken in a limiting sense. The scope of the invention is best determined by reference to the appended claims.

Figure 1:
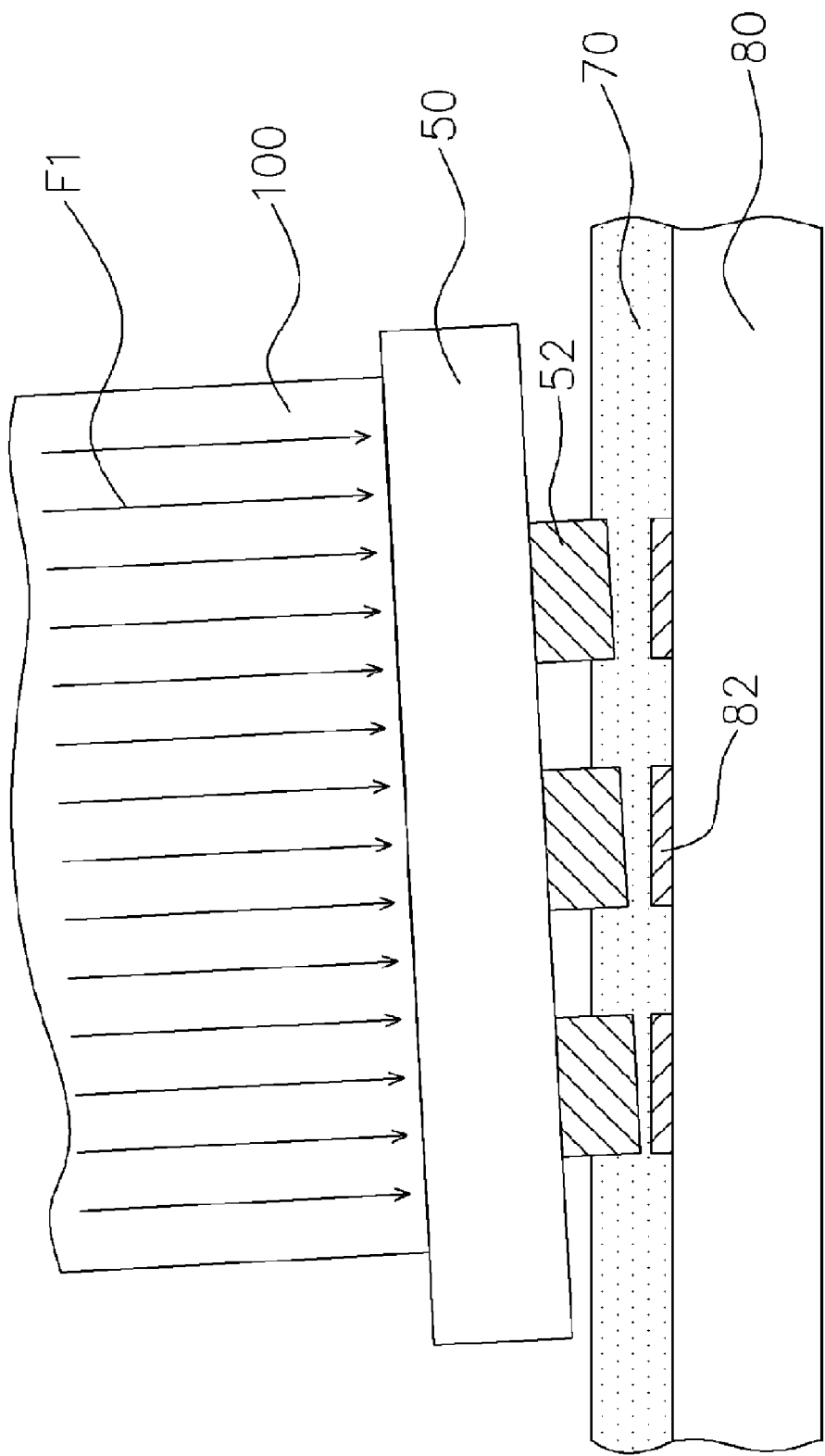
FIG. 1 is a schematic drawing of the conventional technology for bonding chips onto glass substrates.
Figure 2:
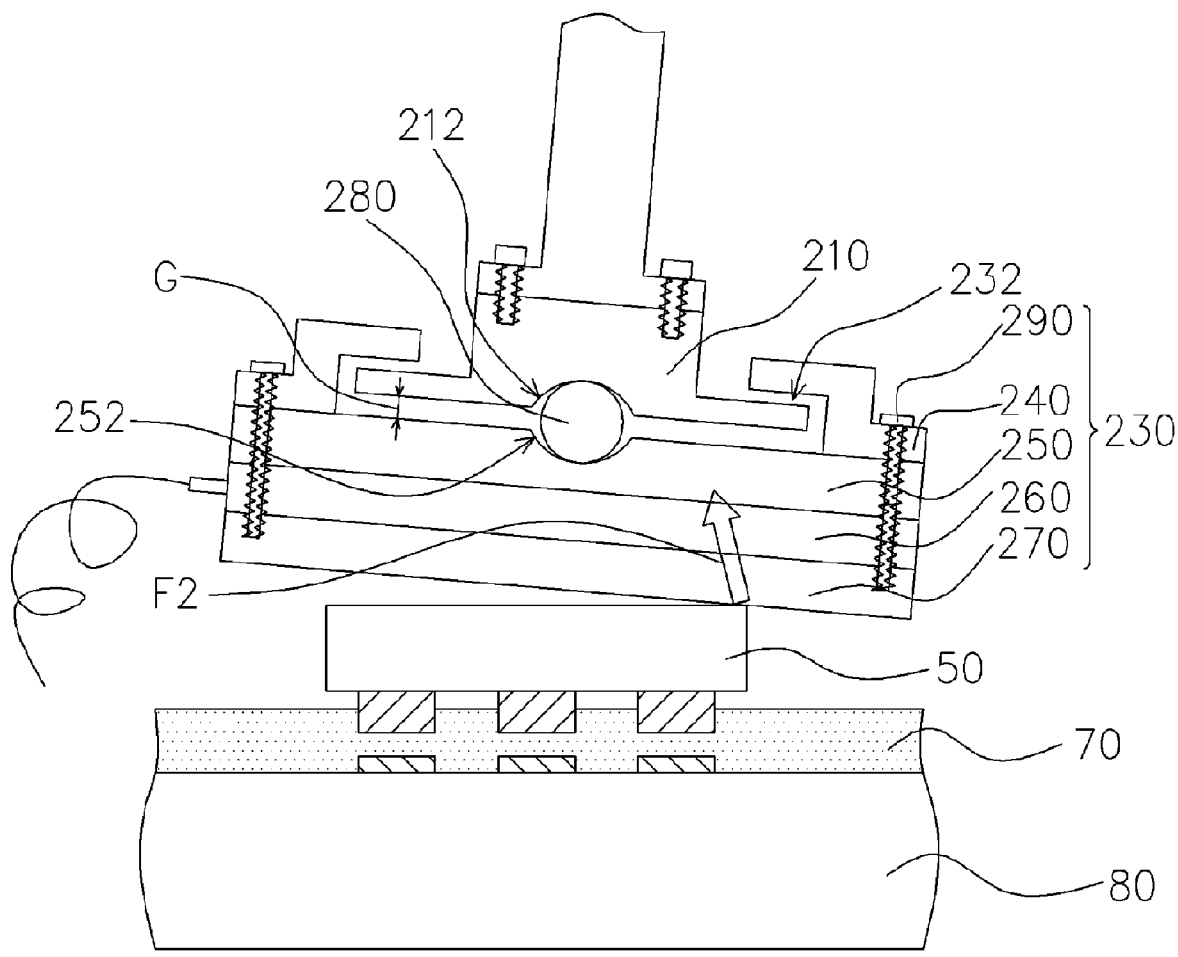
FIG. 2 is a cross-sectional view of the chip compressing mechanism in accordance with one embodiment of the present invention.
Figure 3:
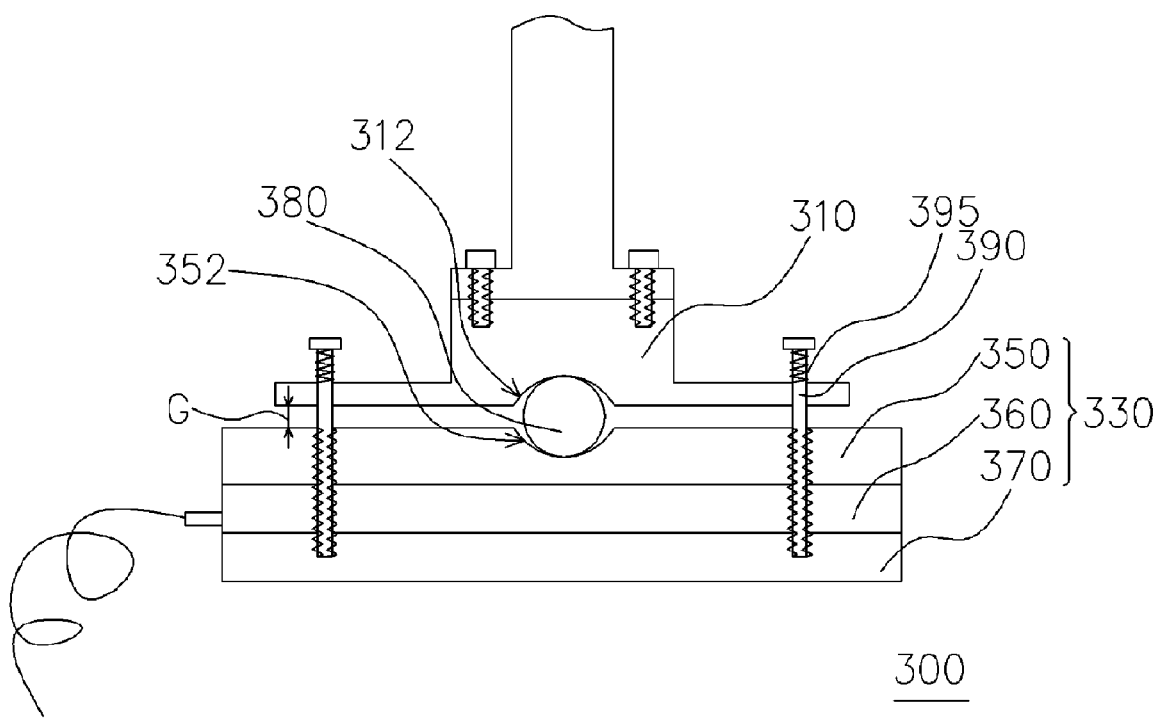
FIG. 3 is a cross-sectional view of the process for compressing chips in accordance with one embodiment of the present invention.

FIG. 2 is a cross-sectional view of the chip compressing mechanism in accordance with one embodiment of the present invention. FIG. 3 is a cross-sectional view of the process for compressing chips in accordance with one embodiment of the present invention. As shown in FIGS. 2 and 3, the main elements of the chip compressing mechanism 200 and 300 are the same. The mechanism 200 comprises a loading component 210, a head component 230 and a gimbal 280 and the mechanism 300 comprises loading component 310, a head component 330 and a gimbal 380. The head component 230 is disposed under the loading component 210 and the head component 330 is disposed under the loading component 310. The gap G between the loading component 210 and the head component 230 and between the loading component 310 and the head component 330 enable the two components to move correlatively. The head components 230, 330 are used to compress at least one chip 50 for it to be electrically connected to the substrate 80 (as shown in FIG. 2). The gimbal 280 is disposed between the loading component 210 and the head component 230 to support the gap G therebetween, and the gimbal 380 is disposed between the loading component 310 and the head component 330 to support the gap G therebetween.

The loading components 210, 310 and the head components 230, 330 get in point-contact with the gimbals 280, 380 respectively, with the gaps G existing therebetween. Therefore, when the head components 230, 330 bear external force, the loading components 210, 310 will rotate or respond according to the pressure thereon.

In addition, the loading components 210, 310 of the chip compressing mechanism 200, 300 have notches 212, 312, wherein the gimbals 280, 380 are disposed respectively.

As shown in FIG. 2, the head component 230 has a groove 232. The bottom surface of the loading component 210 against the head component 230 is large enough to be inset into the groove 232. In the embodiment, the head component 230 comprises at least a gasket 250 and a ring piece 240. The gimbal 280 rests on the surface of gasket 250 and the ring piece 240 is fixed on the gasket 250. While the outer edge of the ring piece 240 is fixed on the gasket 250, the inner edge of the ring piece 240 does not touch on the gasket 250 but both consist the groove 232. The notch 252 on the gasket 250 further enables the gimbal 280 to position more appropriately.

In addition, the bonding of chips onto glass substrates requires not only pressure on the chips, but also heat on the chips. Therefore, the head component 230 further comprises a heating plate 260, which is fixed under the bottom surface of gasket 250, to heat up the chip 50. The heating plate 260 is heated by thermal resistance.

Moreover, the head component 230 also includes a gasket 270, fixed below the heating plate 260, wherein the heating plate 260 is located between gaskets 250, 270. The ring piece 240, the gasket 250, the heating plate 260 and the gasket 270 are joined together by a fixing piece 290, which can be a screw. Of course, other fixing equipment can also be used to assemble the plates of the head component 230.

As shown in FIG. 3, the chip compressing mechanism 300 has two fixing pieces 390, which run through the loading component 310 and nails down the head component 330. Since the loading component 310 can slide correlatively to the fixing piece 390, when the head component 330 bears external force, the loading component 310 will rotate or respond according to the pressure thereon. In addition, the chip compressing mechanism 300 further comprises a plurality of elastic joints 395, located in parts of the fixing pieces 390 that are exposed outside the loading component 310 and the head component 330. As shown in FIG. 3, for example, the elastic joints 395 are placed in the fixing pieces 390 on the exposed parts outside the loading component 310. In the embodiment, the fixing pieces 390 can be screws and the elastic joints can be springs.

The head component 330 shown in FIG. 3 comprises gaskets 350, 370 and a heating plate 360. Please refer to the gaskets 250, 270 and the heating plate 260 in FIG. 2 for details as their structures and functions are the same.

The present invention also provides a process for compressing chips by the chip compressing mechanism 200 as shown in FIG. 2. It should be noted that the process is not designed exclusively for the chip compressing mechanism 200, but can be applied to other mechanisms as long as the following steps are completed. The process starts by disposing at least one chip 50 on substrate 80, wherein an anisotropic conductive film 70 (ACF) is placed therebetween. And then, the chip compressing mechanism 200 is pressed down. If the contact point between the head component 230 and the chip 50 is not in a parallel angle, the chip 50 will provide an acting force F2 on the contact point and the head component 230 will rotate to the parallel level with the chip 50. Therefore, the pressure from the loading component 210 can be transferred by the gimbal 280 through the head component 230 onto the chip evenly in a direction perpendicular to the substrate 80. Since the head component 230 is self-aligned when pressing on the chip 50, the chip compressing mechanism 200 is able to compress the chip 50 onto the substrate 80 evenly.

The process of applying the chip compressing mechanism 200 to compress the chip 50 on the substrate 80 further comprises the step of heating the chip 50 by the heating plate 270. This is to solidify the anisotropic conductive film 70 so the electrical connection between the chip 50 and the substrate 80 can be stabilized.

To sum up, the mechanism and process for compressing chips in the present invention provides an adjustable connecting point between the loading component and the head component so the head component can be self-aligned when pressing the chips and the pressure on the chips can be delivered evenly. Therefore, the chips can bond to the substrate thereon in a parallel angle. That is, the contact resistance between the bumps on the chips and the contact pads on the glass substrate can be almost equal so the uneven situation can be avoided. So the present invention, the mechanism and process for compressing chips, can promote the yield factor of bonding chips onto the glass substrates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mechanism for compressing chips, comprising:
a loading component;
a head component disposed under the loading component, wherein the head component has a heating plate therein, and a gap is existed between the loading component and the head component, and wherein the head component has a groove and the bottom of the loading component is partially inset into the groove, the head component comprising a first gasket having a contact part with the gimbal a ring piece fixed an the first gasket, wherein the ring piece has a hollow portion such that the groove is (existed) between the ring piece and the first gasket; and a gimbal disposed between the loading component and the head component to support the gap there between.

2. The mechanism for compressing chips of claim 1, wherein the upper surface of the first gasket has a first notch, where the gimbal is disposed.

3. The mechanism for compressing chips of claim 1, wherein the heating plate is fixed under the bottom surface of the first gasket.

4. The mechanism for compressing chips of claim 3, wherein the head component further comprises a second gasket fixed below the heating plate, such that the heating plate is placed between the first gasket and the second gasket.

5. The mechanism for compressing chips of claim 3, wherein the head component further comprises at least one fixing piece joining the ring piece, the first gasket, the heating plate and the second gasket.

6. The mechanism for compressing chips of claim 4, wherein the fixing piece comprises a screw.

7. The mechanism for compressing chips of claim 1, wherein the bottom surface of the loading component has a second notch, where the gimbal is disposed.

* * * * *